(12) United States Patent
Dietz et al.

(10) Patent No.: US 6,353,319 B1
(45) Date of Patent: Mar. 5, 2002

(54) MAGNETIC RESONANCE APPARATUS WITH ACTUATORS FOR COUNTERACTING MULTI-ORDER VIBRATIONAL MODES

(75) Inventors: Peter Dietz, Nuremberg; Rudolf Roeckelein; Winfried Arz, both of Erlangen, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/343,848

(22) Filed: Jun. 30, 1999

(30) Foreign Application Priority Data

Jun. 30, 1998 (DE) .......................... 198 29 296

(51) Int. Cl.⁷ ........................ G01V 3/00; G01R 33/20
(52) U.S. Cl. ........................ 324/318; 324/322
(58) Field of Search .................. 324/318, 319, 324/320, 321, 322

(56) References Cited

U.S. PATENT DOCUMENTS 3,722,290 A * 3/1973 Weber et al. .................. 73/382
5,617,026 A    4/1997 Yoshino et al. ............. 324/318
5,698,980 A * 12/1997 Sellers et al. ............... 324/318

FOREIGN PATENT DOCUMENTS

JP           8-257008         8/1996

OTHER PUBLICATIONS

"Vibration Control of a Cylindrical Shell Used in MRI Equipment,"Qiu et al., Smart Mater. Struct. vol. 4 (1995) A75–A81.

* cited by examiner

*Primary Examiner*—Hezron Williams
*Assistant Examiner*—Tiffany A. Fetzner
(74) *Attorney, Agent, or Firm*—Schiff Hardin & Waite

(57) ABSTRACT

A magnetic resonance apparatus has a gradient tube at which at least one gradient coil with current flowing therein in operation is arranged, and at which a number of elements for generating a force acting on the gradient tube as needed are arranged, with the positions of the elements being selected dependent at least on the vibratory mode of the gradient tube, so that a counteracting mode is excited given drive of the elements. The elements serving for the excitation of X and/or Y modes are distributed in the middle and around the circumference of the gradient tube with respect to the length of the gradient tube and/or the elements serving for the excitation of the Z mode are distributed along the length and the circumference of the gradient tube.

30 Claims, 7 Drawing Sheets

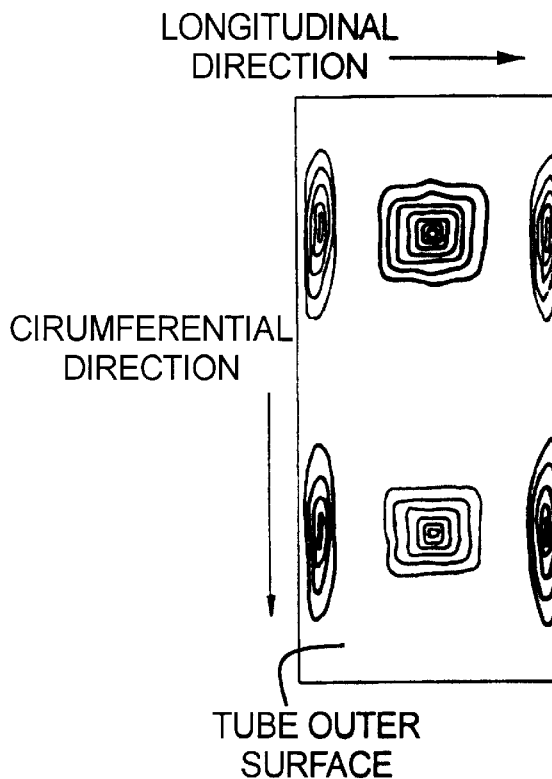
FIG. 1 TUBE OUTER SURFACE
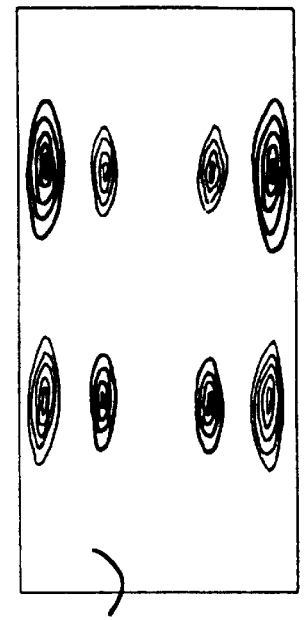
FIG. 2 TUBE INNER SURFACE
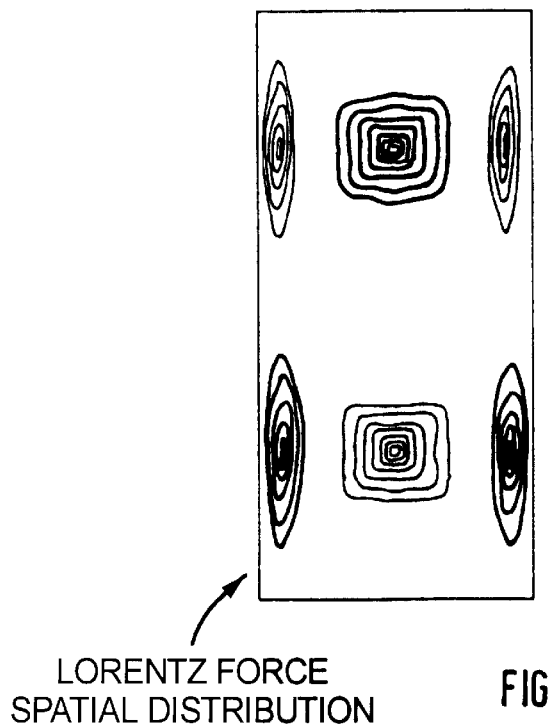
FIG. 3 LORENTZ FORCE SPATIAL DISTRIBUTION
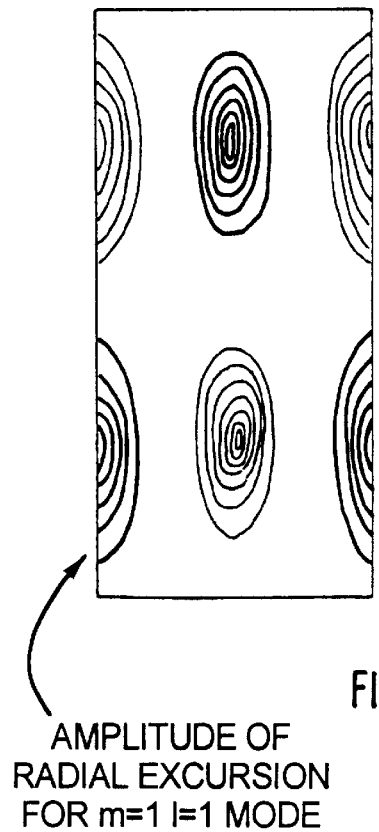
FIG. 4 AMPLITUDE OF RADIAL EXCURSION FOR m=1 l=1 MODE

MAGNETIC RESONANCE APPARATUS WITH ACTUATORS FOR COUNTERACTING MULTI-ORDER VIBRATIONAL MODES

BACKGROUND OF THE INVENTION

1. Field of the Invention

The present invention is directed to a magnetic resonance apparatus of the type having a gradient tube at which at least one gradient coil, in which current flows in operation, is arranged and at which a number of elements for generating a force acting on the gradient tube as needed are arranged, wherein the position of the elements is selected dependent on at least one mode of characteristic vibration of the gradient tube such that this mode of characteristic vibration can be excited upon operation of the elements.

2. Description of the Prior Art

In a magnetic resonance apparatus tomograms of the subject to be examined, usually a patient, are produced through specific body planes. This occurs using electromagnetic fields. In order to enable a spatial resolution of the signal obtained in the presence of a magnetostatic basic field and an exciting radio frequency field, a gradient field is generated with a number of gradient coils. Three different gradient coils are usually utilized, generating fields in the x-y-z directions with respect to the gradient tube. Lorentz forces occur due to the flowing current, these forces acting on the gradient tube and exciting the tube to vibrate as a result of their time curve. These mechanical vibrations in turn excite the air around the gradient tube to produce fluctuations of air pressure. These fluctuations are the cause for a considerable creation of noise during the operation of a magnetic resonance apparatus, whereby noise spikes far above 100 dB occur. In order to oppose these vibrations and, consequently damp the noise, German OS 44 32 747, for example, discloses that forces be generated with piezoelectric elements that are arranged at the gradient tube, these forces opposing the Lorentz forces and thus reducing the vibrations excited by Lorentz forces. The disclosed arrangement of the piezoelectric elements, however, ensues essentially in the region of the coil conductors. The described arrangement is non-selective in view of the vibrations actually generated; a targeted damping of noise, consequently, is not possible.

The article by J. Qiu, J. Tani, "Vibration Control of a Cylindrical Shell Used in MRI Equipment" in Smart Mater. Struct. 4, 1995, A 75–A 81, provides a theoretical approach with respect to the arrangement of piezoelectric elements. This, however, is based on boundary conditions that are not established in practice, for which reason it leads to results that are not practically unusable. Further, Japanese Application 08-257 008 A discloses the possibility of employing piezoelectric elements for reducing noise.

SUMMARY OF THE INVENTION

An object of the present invention is to provide a magnetic resonance apparatus wherein an effective noise damping is realized.

For solving this problem, in a magnetic resonance apparatus of the type initially described, elements are inventively provided serving for the excitation of X and/or Y vibration modes which are distributed in the middle and over the circumference of the gradient tube with respect to the length of the gradient tube and/or elements serving for the excitation of Z vibration modes are distributed along the length and the circumference of the gradient tube.

The inventive arrangement of the elements is based on the fact that each vibration of the gradient tube is a superimposition of a number of vibration modes, i.e. each vibration can be reduced to specific component vibration modes. The vibration modes can make different contributions to the actual tube vibration. In the inventive apparatus, the arrangement of the elements makes it advantageously possible to intentionally and definitively excite at least one vibration mode that opposes respective component of the vibration mode of the tube vibrations and eliminates them. As a result, the tube vibration can be effectively opposed, leading to a damping thereof, and thus a damping of the generated noise as well.

The basic magnetic field proceeds along the cylinder (tube) axis; and the high currents flow within cylinder shells, for which reason the arising Lorentz forces are radially directed. The spatial distribution of the Lorentz forces is approximately symmetrical in the longitudinal direction of the tube toward the middle of the length of the tube. Given X and Y gradients, forces with opposed phase are exerted on locations lying opposite one another in the circumference direction. This means that this Lorentz force only excites characteristic vibration modes that exhibit corresponding symmetry properties. These are only those modes with uneven mode parameters, i.e. with an uneven number of equaiphase antinodes, for which reason the elements are inventively placed dependent at least on one vibration mode having uneven mode parameters. Since the elements can be inventively placed dependent on circumferential and/or longitudinal vibration modes, which is due to a desire that no significant radial vibrations within the tube occur in the acoustically relevant frequency range, it is particularly modes with uneven circumferential parameter and uneven longitudinal parameter that are relevant. The element placement can be such that only circumferential vibration modes can be generated, since it has proven that each of the characteristic modes under consideration is composed of circumferential and longitudinal vibrations, and, due to the symmetry established by the Lorentz force of the X-Y gradient, it is particularly characteristic forms having circumferential vibrations with uneven mode numbers and longitudinal vibrations that are symmetrical toward the middle of the tube that are excited. Since the suppression of only one component, i.e. either of the circumferential vibration or the longitudinal vibration, leads to the elimination or damping of the entire vibration mode and since the circumferential vibration modes can be more easily defined and separated, it suffices to select the position of the elements only on the basis of these circumferential vibration modes and to generate only such circumferential vibration modes for noise elimination. As a result of the symmetry properties of the relevant vibration modes that have already been described, the elements for generating the X and/or Y vibration modes are arranged in the middle and distributed over the circumference with respect to the length of the gradient tube. The elements thus need not be applied over the entire length of the gradient tube; on the contrary, an arrangement that is selected centrally and only at specific tube angle positions leads, due to symmetry, to an adequate damping by itself. A further advantage is that all even-numbered vibration modes exhibit an vibration node in the middle, so that a central arrangement assures that no undesired vibrations are excited during the "elimination"; these would in turn have a disadvantageous effect. Since the greatest unstiffened expanse in the longitudinal direction usually occur in the middle of the tube, a central positioning relative to the tube is also the most effective. As already described, it suffices for the elimination of the vibrations caused by Lorentz forces to excite only uneven circumferential vibration modes. To this end, the placement of the elements for exciting circumferential vibration modes can be selected with a mode number m=1, m=3 and, if necessary, m=5. Higher-numbered modes are not excited at the given operating frequencies, or are only excited to a negligible extent; their discrete elimination is not absolutely required.

The Z gradient, by contrast, is largely anti-symmetrical in the longitudinal direction toward the tube center. Only longitudinal vibrations that exhibit the same anti-symmetry are thus excited, i.e. points that are equidistant from the tube center in different directions vibrate with the same amplitude but with opposite phase. Consequently, only even-numbered modes are relevant here, for which reason these elements, dependent on the Z vibration modes (longitudinal vibrations), are placed to excite longitudinal vibration modes having even-numbered mode numbers. The elements are distributed along the length and the circumference of the gradient tube. Consequently, the elements serving to generate the Z vibration modes are only locally arranged distributed at selected positions along the length and the circumference, so that, as in the case of the X and Y vibration modes, the introduction of forces to generate vibrations ensues at only specific points at the tube. Since no movement occurs in the circumferential direction, the elements are arranged at the outside in the longitudinal direction. As a consequence of the anti-symmetry, they can be placed along the pipe length distributed at a number of selected locations. It is adequate to select the local arrangement for exciting longitudinal vibration modes with a mode number of l=2, l=4 and, if necessary, l=6. The elements respectively enable a quasi punctiform force generation, or introduction of force, into the tube. Each element thus makes a generation of force possible in a very small surface region of the pipe. This and the inventive placement of the elements enable the selective mode excitation. This also applies when each element for generating the required force is composed of a number of individual elements that are arranged very closely next to one another. Here, too, a quasi punctiform introduction of force ensues.

As already described, the inventively achieved noise damping is essentially based on selective and definitive excitation of vibration modes. In the ideal case, exactly one mode would be excited to oscillate with the element distribution being selected specific to that mode and all others would not be influenced. In real terms, however, the modes m=3 and m=5 are also co-excited given, for example, excitation with the circumferential vibration mode m=1. In order to be able to suppress these vibrations which are unintentionally excited, further elements can be inventively provided for generating one or more modes, these opposing these unintentionally excited modes. For symmetry reasons, only odd-numbered vibration modes (given the X and Y gradient coils) or even-numbered modes (given the Z-gradient coil) are also excited here, for which reason the arrangement of the further elements can be selected for elimination of odd-numbered and/or even-numbered modes, i.e. the further elements are arranged such that they can generate corresponding suppression vibrations. As a rule, a number of secondary modes are co-excited upon operation of the primary mode elements, for which reason the further elements can be arranged such that the mode or modes they generate simultaneously oppose two vibration modes to be eliminated. This is dependent on the "principal mode" to be suppressed, particularly the vibration modes m=1, m=3, or m=1, m=5, or m=3, m=5, and l=2, l=4, or l=2, l=6, or l=4, l=6. The drive of the further elements should be such that they, in terms of their overall force influence on the gradient tube, essentially completely compensate the force influence of the first elements in view of the modes to be eliminated, i.e. the further elements are driven such that the magnitude of the force that the first elements have on the generation of the unwanted vibration modes is substantially completely compensated. The effectiveness with which a further element can compensate the force contribution of the "principal element" is positionally dependent, i.e. an element driven the same as a "principal element" can only compensate a specific percentage of the force. This is to be taken into consideration in the respective drive of the "principal elements" and the further elements. The elements, and if necessary the further elements as well, can be inventively arranged with their influencing direction in the circumferential and/or longitudinal directions of the gradient tube. The respective attachment is selected dependent on the vibration mode to be generated. For example, a mode m=1 cannot be generated by elements arranged in the circumferential direction since, given this mode, no deformation in the circumferential direction occurs and thus no expansion in the circumferential direction occurs. This mode can only be adequately eliminated with elements arranged in the longitudinal direction. The advantage of such an attachment is also that all other vibration modes are excited with such an alignment and with adequate coupling, so that attachment in the longitudinal alignment is most expedient. The elements, and possibly the further elements, can be inventively arranged at the outside of the tube and/or inside of the tube. The outside arrangement has proven particularly expedient since the circumferential vibration m=1 that supplies a significant contribution to the noise creation can only be generated, and thus eliminated, given outside arrangement.

The elements, and possibly the further elements, should be respectively arranged paired, with elements in a pair lying opposite one another at the gradient tube and should be capable of being operated with opposite phase, this condition applying both to the elements acting in the circumferential direction as well as in the longitudinal direction. Expediently, the first elements can be arranged at the gradient tube at 0° and 180° relative to the direction of the gradient axis in question, and the further elements for eliminating the circumferential vibration modes m=3 and m=5 at ±45° and ±135° given an excitation of the mode m=1, and the further elements for eliminating the circumferential vibration modes m=1 and m=5 at ±60° and ±120° with respect to the tube cross-section given excitation of the mode m=3. These specific arrangements permit an adequate elimination of the odd-numbered vibration modes that are respectively unintentionally generated; the respective force components of the generating elements can be nearly completely compensated given the corresponding angular arrangement and the paired elements.

Compared thereto, the elements for exciting the longitudinal vibration mode l=2 can be arranged at $\frac{2}{6}$ and $\frac{4}{6}$ of the tube length and the elements for eliminating the longitudinal vibration modes l=4 and l=6 can be arranged at $\frac{1}{6}$ and $\frac{5}{6}$ of the length of the gradient tube, and the elements for exciting the longitudinal vibration mode l=4 can be arranged at $\frac{4}{10}$ and $\frac{6}{10}$ of the tube length and the elements for eliminating the longitudinal vibration modes l=2 and l=1 can be arranged at $\frac{2}{10}$ and $\frac{8}{10}$ of the tube length. As described, each tube vibration mode can be reduced to a superimposition of modes. The relationship of the vibration-forming modes, however, changes with the frequency of the influencing Lorentz force, which is in turn dependent on the operating frequency of the gradient coil. In order to take this into account, in an embodiment of the invention the elements, and possibly the further elements, can be operated such that the force they exert changes dependent on the operating frequency of the gradient coil, and thus on the generated Lorentz force. It is thereby assured that the generated "anti-vibration" and the "elimination vibration" are adequate and neither too strong nor too weak in order to achieve an optimum degree of opposing effect. With respect to the Z gradient, this frequency-dependent drive makes it possible to arrange the elements for exciting the longitudinal vibration modes only in two positions symmetrical relative to the tube center at which none of the relevant longitudinal vibrations exhibit a vibration node. These elements that are preferably symmetrically distributed around the circumference and are identically driven. A number, particularly more than six, are provided in order to avoid an unintended excitation of circumferential vibrations. As a result of the anti-symmetry and taking the element-specific force influence on the respective vibration mode into consideration, an adequate vibration generation and elimination is thus possible over a considerable frequency range. The elements themselves can be piezoelectric elements that are appropriately designed in view of the stressing, preferably as a stack of a number of elements.

In general each element can be composed of a number of individual elements that are arranged at or in the immediate environment of the predetermined tube position. In any case, both for employment of only a single element at a tube position or given employment of a plurality of individual elements at a pipe position lying in close proximity to one another, a quasi punctiform force generation or force introduction into the gradient tube occurs, i.e. a force generation or force introduction that is very limited in terms of surface area.

DESCRIPTION OF THE DRAWINGS

FIGS. 1 and 2 show the spatial distribution of the Lorentz forces of the X gradient on the outside (FIG. 1) and inside (FIG. 2) surface as a surface force on a cylindrical surface.

FIGS. 3 and 4 show a comparison of the spatial distribution of the Lorentz forces of the outer surface (FIG. 3) and the amplitude of the radial excursion of the m=1, l=1 mode (FIG. 4).

DESCRIPTION OF THE PREFERRED EMBODIMENTS

Figures 5, 6, 7:
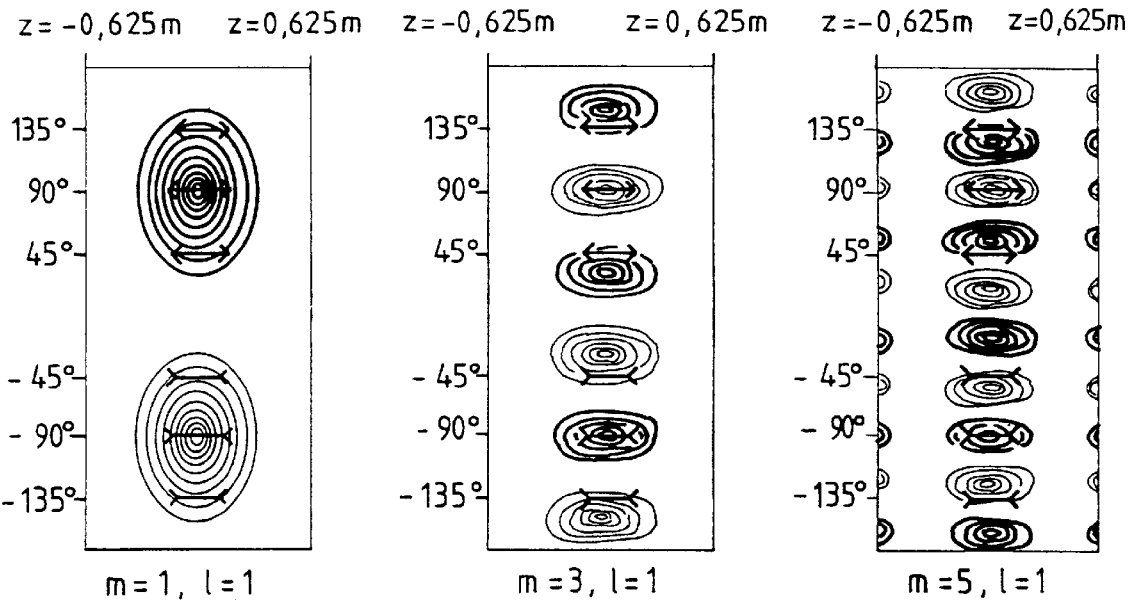
FIGS. 5 through 7 show the excursions in the z-direction (longitudinal direction) of the tube generated given different modes, showing the locations, forces and phases of elements according to a first distribution for exciting an m=1 mode (FIG. 5) while counteracting the m=3 mode (FIG. 6) and the m=5 mode (FIG. 7) in accordance with the invention.

Since the vibrations modes cannot be independently measured, it is necessary to simulate the vibration of the gradient tube. The finite element method is employed for this purpose. The excitation of the gradient tube by the Lorentz forces is always assumed to be harmonic. The oscillatory and noise behavior for each arbitrary, periodic excitation sequence of the superimposition can be formed from the individual harmonic excitations weighted with respective Fourier coefficients. A free vibration of the gradient tube is assumed since the holder in fact holds the coil in place, i.e. largely prevents movements of rigid bodies, but is not able to decisively change the shape of the flexural vibrations. In order to achieve this, a structure that requires an unreasonable outlay for material would be necessary given a tube weighing approximately half a ton and excursions in the micrometer range. Measurements show that this assumption is completely justified.

Given a linearly elastic material behavior, each harmonic vibration can be represented as a superimposition of the characteristic vibrations of the structure. These characteristic vibrations with the characteristic frequencies belonging thereto are dependent on the geometry, the material properties and the boundary conditions (for example, the restraint), whereas the influencing forces and the excitation frequency ultimately yield the coefficients in the superimposition of these modes to form the overall vibration. Modal load factors, i.e. a real number per characteristic form, already arise merely from the spatial distribution in the framework of modal analysis, these indicating how well the predetermined force distribution excites the respective vibration mode. Frequency and damping then enter into the superimposition of the individual frequency components.

In addition to its frequency, each vibration also has a mode. Flexural vibrations prevail in the acoustically relevant frequency range. Radial vibrations in the gradient tube itself only occur at higher frequencies. The vibration components thus can form in two spatial dimensions, namely in the circumferential direction and the longitudinal direction of the tube. Consequently, the modes occurring in this frequency range can be classified as circumferential and longitudinal modes. The circumferential parameter m and the longitudinal parameter l serve this purpose. M=0 thereby denotes that all points of the tube circumference exhibit the same radius at every point in time. m=1 indicates that the radial component of the tube motion with respect to the longitudinal axis of the system approximately describes a sine curve, given small excursions on the circumference; i.e. a cross sectional translation exits. m≧2 means that a recognizable deformation of the tube circumference occurs. m thereby indicates the number of equaiphase antinodes on the circumference.

The parameter l, by comparison, represents the number of completely formed antinodes along the entire length of the gradient tube. There are also three classes of special modes in addition to the pure longitudinal mode described by this classification. Whereas all modes having normal longitudinal vibration exhibit equaiphase excursions at both longitudinal ends of the pipe, there are respective, additional versions for the l=0 mode as well as for the m=0, l=1 and the m=1, l=1 modes that have antiphase excursions at the longitudinal ends, i.e. an appearance that is anti-symmetrical toward the middle of the length of the tube, which is identified below with an "a". Further, there are flattening motions that act either as a sole vibration mode or that are superimposed on other vibration modes. These modes are identified by an "st" following the designation of the basic mode. Finally, rotational movements also occur in the frequency range under consideration. Regions lying next to one another in the longitudinal direction thereby rotate in different directions. These characteristic forms are identified by a "dr" following the designation of the basic mode.

The modes that can be caused to oscillate at all by the Lorentz force generated during operation of the gradient coils and that make a relevant contribution to the noise production at all are to be selected.

The cause of the noise occurring in the magnetic resonance system is the electrical currents flowing in the gradient coils in the presence of the basic magnetic field. Only the affect of the X gradient coil is investigated below; however, the results can be transferred to the nearly identically constructed Y gradient coil.

The basic magnetic field that is generated with the superconducting magnet of the magnetic resonance apparatus proceeds along the cylindrical tube axis. The currents of the gradient coils flow mainly on cylinder shells, for which reason the arising Lorentz forces are radially directed. The X gradient coil is composed of a number of symmetrical saddle coils, each of which is composed of a primary coil and a secondary coil that are installed at different radii. Both of these coils have the same current flowing therein; however, the current directions in the primary coil and in the secondary coil are substantially opposite. As a result of the radially different position and the different design, the two coils supply different and opposite contributions to the resulting force. This causes the gradient tube to oscillate. The spatial distribution of the Lorentz force of the primary and secondary coils on the outer surface is shown in FIG. 1 and is shown as surface force on the inner surface in FIG. 2. The cylinder surface of the tube are shown. The regions shown with different line thicknesses indicate that the forces are oppositely directed in these regions, i.e. the force in the more heavily identified area is directed opposite the adjacent force in the more lightly identified area. As FIGS. 1 through 3 graphically show, the Lorentz force in the longitudinal direction is symmetrical relative to the middle of the gradient tube. A force with opposite phase is exerted on locations lying opposite one another in the circumferential direction. This means that only those modes are caused to oscillate that have the corresponding symmetry properties. These modes are essentially the modes with an odd-numbered circumferential parameter m and symmetrical longitudinal vibration toward the middle of the length of the gradient tube, i.e. modes having an odd-numbered longitudinal parameter l, as well as few special forms. The following Table 1 shows a selection of relevant modes with modal participation factor that must be taken into consideration:

TABLE 1

| l    | m=0 | m=1 | m=2 | m=3 | m=4 | m=5 | m=6 |
|------|-----|-----|-----|-----|-----|-----|-----|
| 0    |     | +   |     | +   |     |     |     |
| 1    | (+) | +++ | (+) | +   |     | +   |     |
| 1,st |     | ++  |     |     |     |     |     |
| 1,dr |     | +   |     |     |     |     |     |
| 2,dr |     | ++  |     |     |     |     |     |
| 3    |     | ++  |     | (+) |     |     |     |

+++ very strong
++ strong
+ weak
(+) very weak

The m=1, l=1 mode exhibits the greatest modal participation factor. This is set up extremely well by the Lorentz force. A nearly perfect spatial coincidence prevails between this mode and the Lorentz force, as FIGS. 3 and 4 show. FIG. 3 again shows the spatial distribution of the Lorentz force and FIG. 4 shows the amplitude of the radial excursion of the m=1, l=1 mode. The location of the greatest force coincides with the location of the greatest radial excursion. This mode is particularly consequential with respect to the X gradient.

Based on the modal participation factors shown in Table 1, a selection of the important modes responsible for the noise can be made. These are (up to 2000 Hz):

m=1, l=0
m=3, l=0
m=1, l=1
m=3, l=1
m=1, l=1, st
m=1, l=3
m=1, l=1, dr
m=1, l=2, dr
m=5, l=1

Proceeding therefrom, a distribution of the elements for generating compensatory forces is identified, these selectively placed elements being capable of exciting corresponding modes that have a destructive effect with respect to the mode excited by the Lorentz force. Piezoelements are employed as these elements. These are attached on the gradient tube and act thereat to oppose the expansion produced by the mode excited by the Lorentz force. Two attachment directions are available for the piezoelements: they can be attached in the circumferential direction or in the longitudinal direction. Since the m=1 mode cannot be "combated" via piezoelements arranged in the circumferential direction, since no deformation in the circumferential direction occurs given these modes, but these modes are the most important, the piezoelements are attached in longitudinal direction.

For symmetry reasons, the piezoelements are arranged in the middle of the tube, which is the most effective longitudinal position since the excursions are greatest here. Due to the symmetry, such a centralized arrangement has the important advantage that no modes not excited by the Lorentz force can be excited with the piezoelements, since the even-numbered modes exhibit an oscillatory node in the middle of the tube. In order to avoid excitation of other modes not excited by the Lorentz force, namely modes having M=0, 2, 4, 6, the piezoelements are always attached lying opposite one another along the circumferential direction in pairs and are driven with opposite phase. The elements are thus arranged in the middle of the tube and distributed around the tube circumference.

Since corresponding, vibration-caused deformations of the tube are established at the inside as well as at the outside, the piezoelements can be arranged at the inside or outside of the tube. In order to achieve the desired result with optimally few piezoelements, that radial position that enables an excitation of all relevant modes is identified. The possible positions of the piezoelements are reproduced in Table 2. Since the most important mode is m=1, l=1, which only can be combated by piezoelements attached at the outside in longitudinal direction, the arrangement of the elements at these locations is absolutely necessary. Since, however, all other relevant modes can be excited with adequately good coupling with these piezoelements (compare Table 2), it is adequate to provide corresponding piezoelements only at the outside, so that the number of elements can be kept low.

TABLE 2

| | | Characteristic form | | | | | |
|---|---|---|---|---|---|---|---|
| Actuator Direction | Actuator Location | m = 1 l = 1 | m = 3 l = 1 | m = 1 l = 1 flattening | m = 1 l = 3 | m = 3 l = 3 | m = 5 l = 1 |
| longitudinal | inside | o | o | + | o | o | o |
| circumferential | inside | o | ++ | o | o | ++ | + |
| longitudinal | outside | + | + | + | + | + | + |
| circumferential | outside | o | o | o | o | o | o |

++ = very good coupling
+ = good coupling
o = no or very poor coupling

Proceeding therefrom, it is adequate for excitation of m=1 modes to arrange the piezoelements as shown in FIGS. 5 through 7. In FIGS. 5 through 7 (and in FIGS. 8 through 10) the symbol ⇆ designates regions vibrating 180° out of phase relative to regions designated with the symbol ⇌. The two "principal piezoelements" that excite the m=1 mode are arranged at ±90°. They thus lie opposite one another at the circumference. Since the excitation of an m=1 mode also simultaneously excites m=3 and m=5 circumferential modes, further piezoelement pairs are required in order to in turn eliminate these unwanted vibrations. For symmetry reasons, two further piezoelement pairs are employed for this purpose in the illustrated example of the distribution, which are arranged at angular positions at the circumference at which these two circumferential modes to be eliminated exhibit the same amplitudes and phase position (dilatation or flattening) of their circumferential vibration. This prerequisite is met only at the 45° position in each quadrant. Here, both circumferential modes to be eliminated exhibit a phase position opposite the locations of the principal piezoelements; the oscillatory amplitude respectively amounts to 0.707 times the maximum excursion. In order to eliminate the affect of the principal piezo elements on these undesired modes, the influence of the force of the principal piezoelement pair must be compensated. Due to the symmetrical arranged piezoelements, which act in common to generate the compensation force, each of these piezoelements placed at the 45° position of the respective quadrant must compensate exactly half the force influence of the principal piezoelement. This is relevant for the drive of these piezoelements. As a consequence of the 0.707 efficiency factor of these 45° piezoelements, each piezoelement must produce approximately 70% of the force of a principal piezoelement.

The exact arrangement of the principal and elimination piezoelements is shown in FIGS. 5 through 7. Again, the regions shown with different thicknesses represent regions of opposite phase position, i.e. flattening and dilatation. The corresponding drive phase of the respective piezoelement pairs is also indicated. The piezoelement pairs respectively lie at ±90° (principal piezoelements), at +45° and −135° as well as +135° and −45° (elimination piezoelements).

Figures 8, 9, 10:
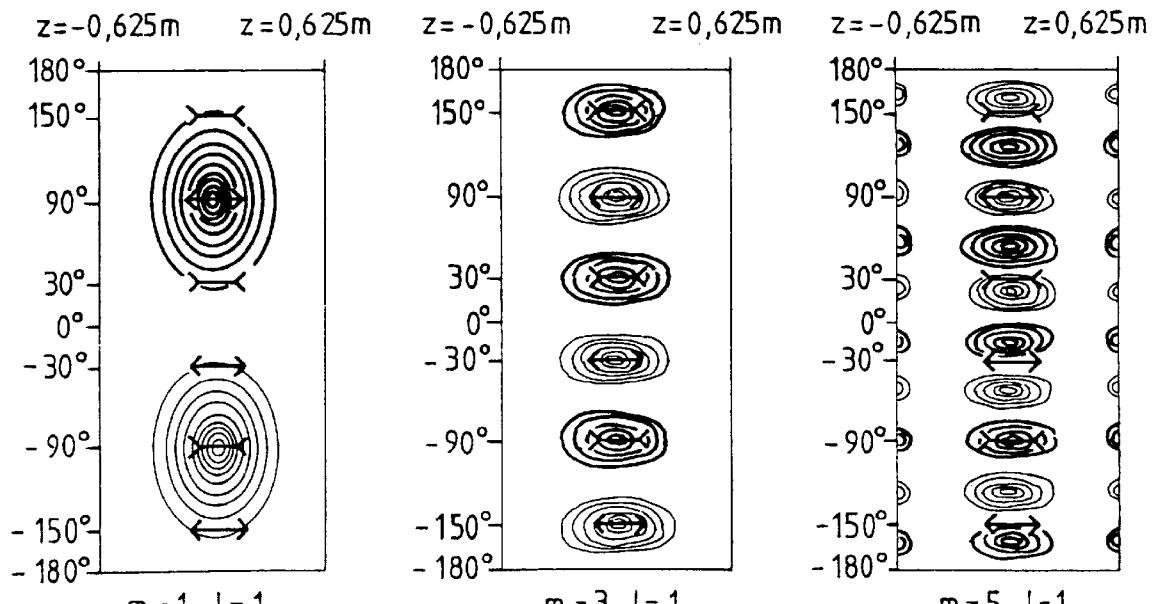
FIGS. 8 through 10 show the excursions in the z-direction of the tube generated given different modes, showing the locations, forces and phases of the elements according to a second distribution for exciting an m=3 mode (FIG. 9) while counteracting the m=1 mode (FIG. 8) and the m=5 mode (FIG. 10) in accordance with the invention.

FIGS. 8 through 10 show a piezoelement distribution that allows only the excitation of the m=3 mode and permits an elimination of the m=1 and m=5 circumferential modes thereby additionally excited. The principal piezoelements here also lie at ±90°. The position at which the oscillatory amplitudes of the circumferential modes m=1 and m=5 to be eliminated are the same lies at 60° angular position with respect to the principal piezoelements in this case. The elimination piezoelement pairs in the illustrated example, consequently, lie at +30°, −150° and +150°, −30°. The effectiveness of these 60° piezoelements is exactly half that of a principal piezoelement, which means that each must be driven with the same force as the principal piezoelement.

Figure 11:
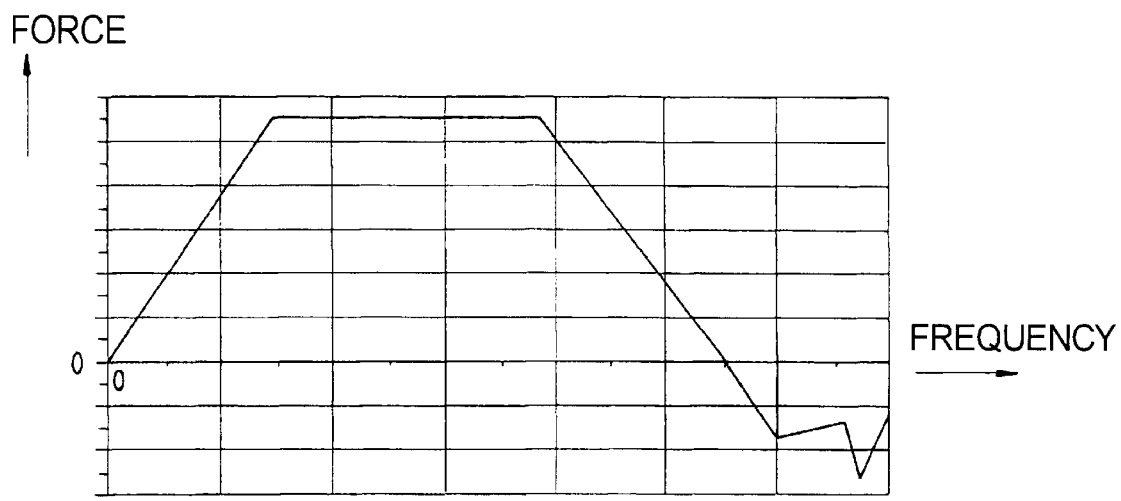
FIG. 11 shows a drive curve for the principal elements of the element distribution according to FIGS. 5 through 7, relative to frequency.
Figure 12:
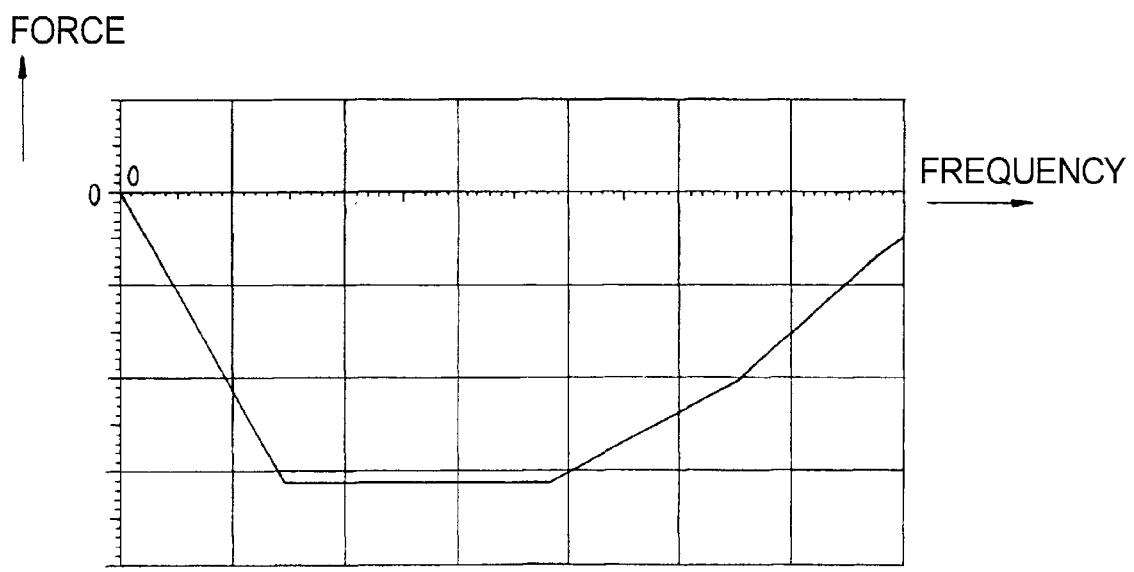
FIG. 12 shows a drive curve for the principal elements of the distribution according to FIGS. 8 through 10, relative to frequency.

All modes with m=1 are combated by the distribution shown in FIGS. 5 through 7. Since there are a number of modes with m=1 that superimpose in effect, the piezoelement force is dependent on the frequency. FIGS. 11 and 12 show the drive curves of the principal piezoelements for the distribution corresponding to FIGS. 5 through 7 and the distribution corresponding to FIGS. 8 through 10. The force curve of the force generated by the principal piezoelements relative to the frequency is shown in the form of a schematic diagram. In the case of FIG. 11, i.e. the distribution of FIGS. 5 through 7, the elimination piezoelements must be driven with 70% of this force; in the case of distribution of FIGS. 8 through 10, all piezoelements are driven with the same force as shown in FIG. 12. The respective phase position should also be taken into account in the drive.

Since the phase shift of the vibration relative to the Lorentz force is only dependent on the frequency and the phase shift also occurs given application of the piezoelement force, it is sufficient for harmonic excitations to align the phase of the piezoelement force with the phase of the Lorentz force. At low frequencies, the piezoelements need not be driven since the noise produced by the system is very low. The needed force remains approximately constant up to the first characteristic frequency, since all modes superimpose in equaiphase. Although the vibration of the first mode dominates the overall vibration, higher piezoelement forces than for the first mode by itself are required due to constructive (additive) superimposition of the participating modes. Beyond the characteristic frequency, the mode associated therewith oscillates in anti-phase to all other modes, and these vibrations superimpose substantially destructively. With increasing deviation from the characteristic frequency of the first mode, the influence thereof on the mode becomes less and the influence of the mode following in the frequency range increases. An unusual behavior occurs in the further course of the amplitude according to FIG. 11. Thus, negative values occur, which correspond to a phase rotation of the piezoelement force by 180°. The reason is due to the mode m=1, l=1, st. Although the Lorentz force causes a downward flexing of the longitudinal ends, the upper surface of the gradient tube flattens, for which reason the piezo elements rotate their phase by 180° as soon as this mode dominates the vibration, in order to achieve a diminution of the oscillatory amplitude. No reduction of the oscillatory movement can be achieved at the frequency at which this transition occurs. A destructive superimposition of the participating modes occurs at this frequency; only a slight residual movement of the gradient tube remains.

Figure 13:
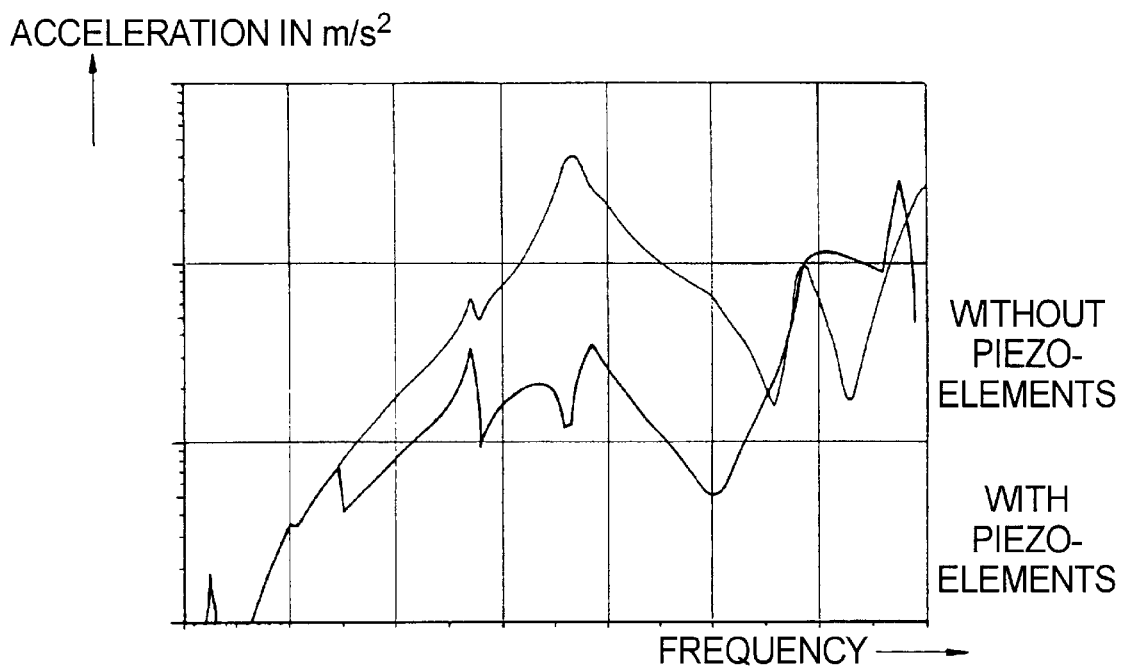
FIG. 13 is a diagram showing the decrease in the mechanical vibration amplitudes due to employment of the elements in accordance with the invention.

Finally, FIG. 13 shows the curve of the mechanical oscillatory amplitude that arises without and with piezoelements. As can be seen, the oscillatory amplitude without employing piezoelements is significantly higher than with piezoelements. The increase of the oscillatory amplitude with piezoelements can be designationally utilized in order to achieve a detuning of the mechanical vibrations relative to the acoustic vibrations, even though these have lower influence in these frequency ranges.

Figure 14:
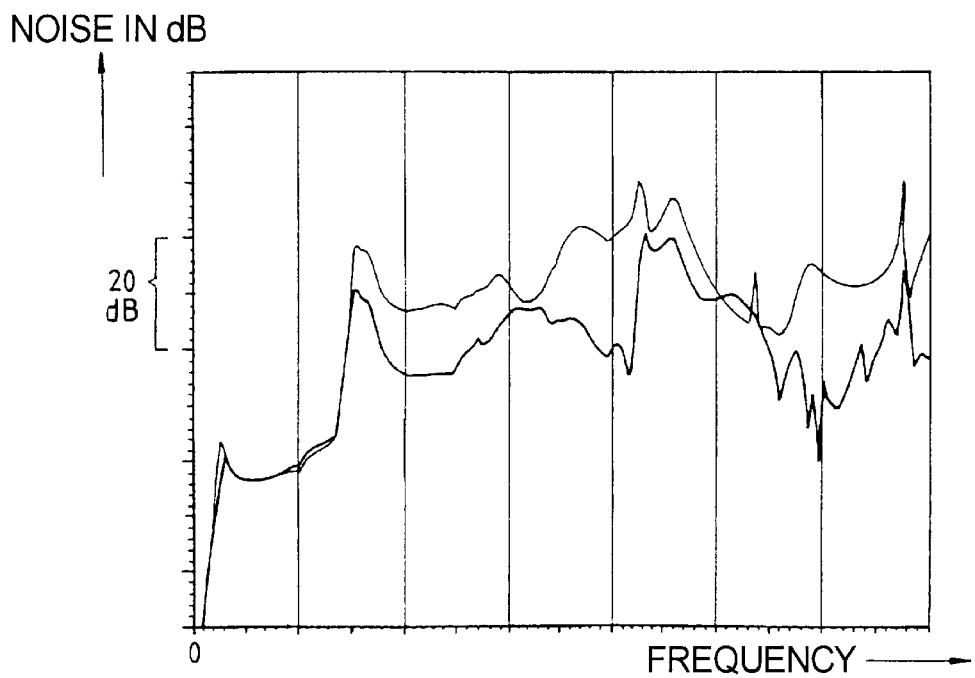
FIG. 14 is a diagram showing the alleviation of noise achieved in accordance with the invention.

FIG. 14 shows the noise spectrum with and without use of the piezoelements. As can be seen from FIG. 14, a considerable noise damping, which can amount to up to 20 dB, can be achieved by using the piezoelements, this being achieved solely by the inventive "counter-excitation" of the noise-producing modes Under ideal conditions, a total vibration quenching would be possible.

Figure 15:
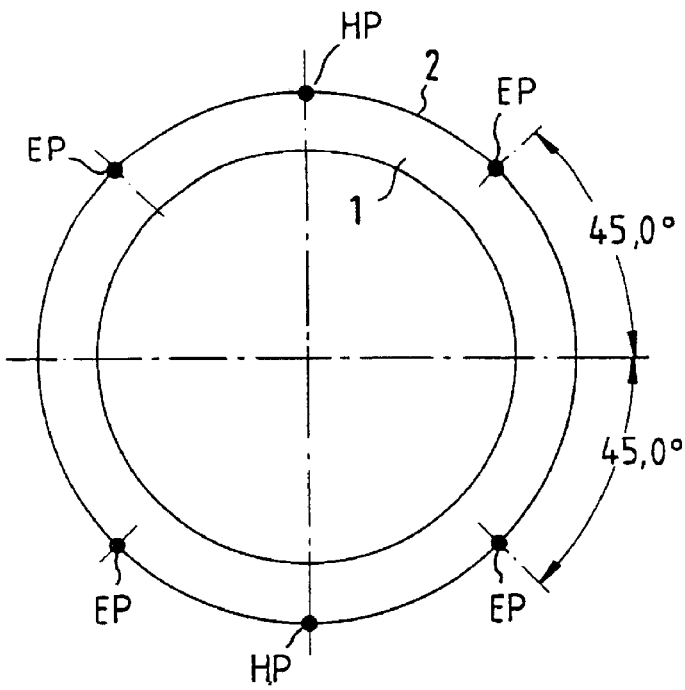
FIG. 15 is a schematic diagram showing the attachment of the elements according to the first distribution according to FIGS. 5 through 7.
Figure 16:
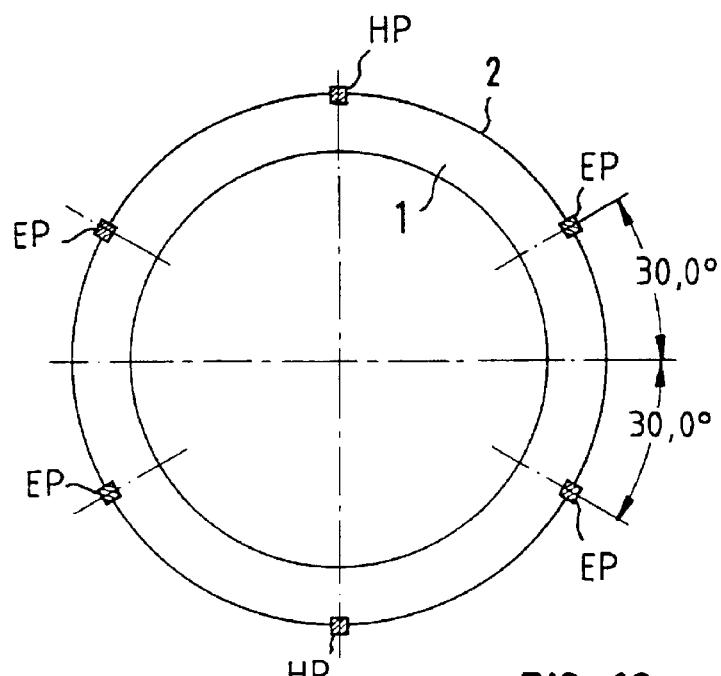
FIG. 16 is a schematic illustration showing o the attachment of the elements according to the second distribution according to FIGS. 8 through 10.

In separate illustrations, FIGS. 15 and 16 show the arrangement of the piezoelements at the gradient tube 1. As can be seen, the piezoelements are arranged at the outside 2 of the tube 1. FIG. 15 thereby shows the distribution according to FIGS. 7 through 9 that serves for generating the m=1 mode. In addition to the two principal piezoelements HP, four further elimination piezoelements EP are provided, these being respectively arranged at angles of 45° with reference to the respective principal piezoelements.

By comparison thereto, FIG. 16 shows the arrangement of the piezoelements according to the distribution of FIGS. 8 through 10. In addition to the two principal piezoelements, the elimination piezoelements EP here respectively lie at angles of 60° relative to the respective principal piezoelements HP.

Figure 17:
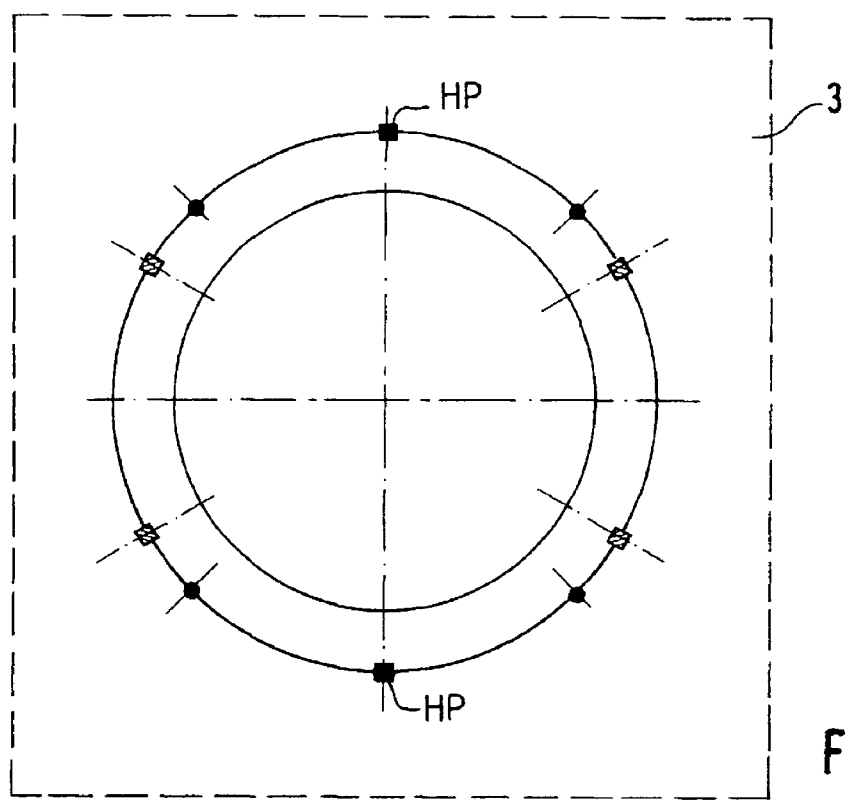
FIG. 17 shows the common attachment of all elements in accordance with the invention.
Figure 18:
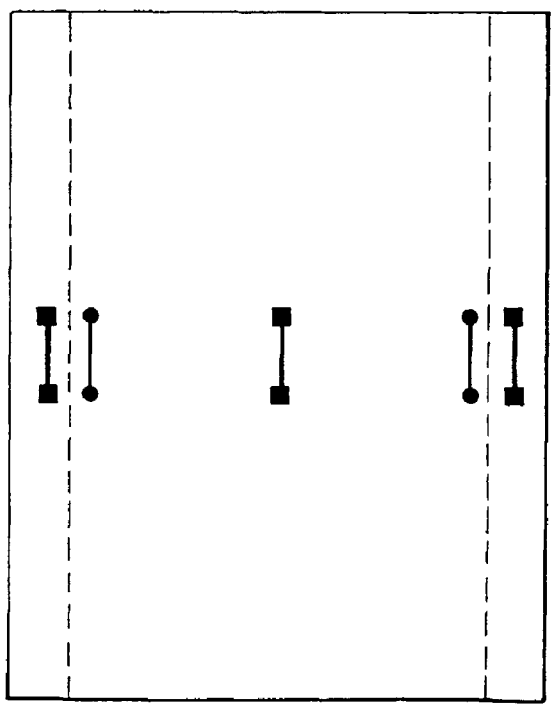
FIG. 18 is a plan view onto the gradient tube of FIG. 17.

Finally, FIG. 17 shows both distributions according to FIGS. 15 and 16 at a tube located in a magnetic resonance apparatus 3. As can be seen, only one principal piezoelement pair is utilized, since these are seated at the same location given both distribution formats. FIG. 18 shows a plan view onto the tube of FIG. 17.

The distributions shown in FIGS. 15 through 18 relate to the X gradient, i.e. are valid for the modes generated by the X gradient coils. In order to also be able to damp modes generated by the Y gradient coil, which are the same in this respect as those generated by the X gradient since the structure of the Y gradient coil is similar to that of the X coil in view of the symmetry and is merely rotated by 90°, the respective arrangement of the piezoelements is rotated by 90° in order to be able to combat the modes generated by the Y gradient.

Figure 19:
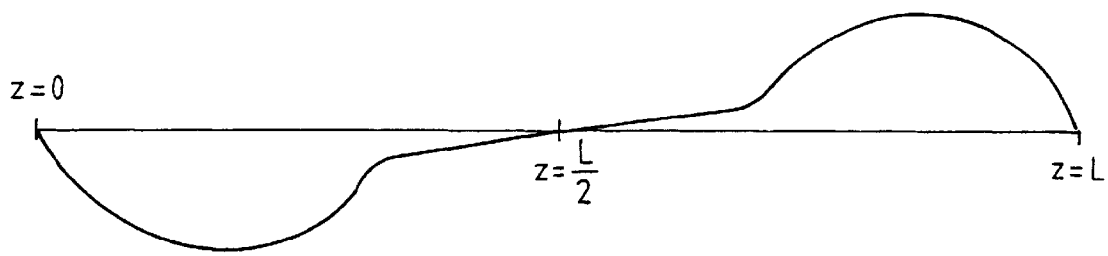
FIG. 19 is a diagram illustrating the curve of the Lorentz force of the Z gradient over the tube length.

In conclusion, an example is provided of an exemplary arrangement of the piezoelements for "combating" modes that are generated by the Lorentz forces produced by the Z gradient coils. FIG. 19 shows a diagram for illustrating the course of the Lorentz force produced by the Z gradient coils along the length of the gradient tube. As can be seen, the force curve is anti-symmetrical to the middle of the tube. This determines the excitable longitudinal vibrations. Only those that exhibit the same anti-symmetry thus can be excited, i.e. the points of the tube that are equidistant from the center of the tube in different directions oscillate with the same amplitude but opposite phase. Only even-numbered longitudinal modes are of note here. One example of these modes is provided by FIG. 20 wherein the modes l=2, l=4 and l=6 are shown as examples.

Since a movement of the surface in the circumferential direction given vibrations that are produced by the Z gradient coils does not occur, the piezoelements, consequently, must be arranged in the longitudinal direction, whereby the greatest dilatations occur at the outside. In order to assure that no undesired modes other than those to be designationally excited are co-excited, for example in the form of circumferential modes, an entire ring of piezoelements would have to be attached to the identified longitudinal position and would have to be operated in phase. Since one of the goals is to manage with optimally few piezo elements, a minimum number of piezoelements must be defined that are to be distributed symmetrically on the circumference. For example, six symmetrically distributed piezoelements that are operated equaiphase are adequate. The circumferential mode of the lowest order that can thereby be excited is the vibration m=12. This is not acoustically relevant.

Since only longitudinal modes having an even-numbered mode number can be excited, only such longitudinal modes are likewise to be generated in opposition. To this end, all piezoelement positions yet to be selected must be symmetrical relative to the tube center, i.e. all locations are mirrored relative to the tube center. As a result of the anti-symmetrical Lorentz force curve, the piezo elements at these mirrored positions must be operated with opposite phase.

It should be noted for the selection of the relevant piezoelement positions that only the modes having a low mode number are relevant for the noise creation. The characteristic frequencies of the modes with l=8 and higher are not in the acoustically relevant range, for which reason the modes l=2, l=4 and l=6 are to be taken into consideration in the position determination.

Figure 20:
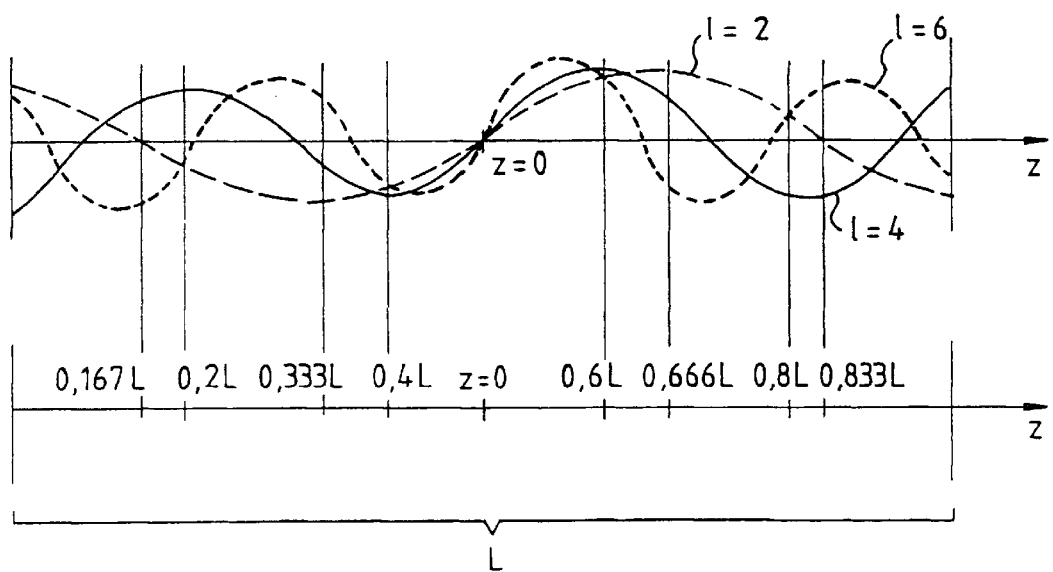
FIG. 20 is a diagram illustrating various longitudinal vibration modes and the element arrangement at the tube for compensating those modes in accordance with the invention.

FIG. 20 shows an example of an expedient positioning. The upper illustration reproduces the curve of the modes l=2. l=4 and l=6; the illustration lying therebelow illustrates the respective piezoelement positions. The element distribution for the excitation of the modes l=2 given simultaneous elimination of the co-excited modes l=4, l=6 and for the targeted excitation of the mode l=4 given simultaneous elimination of the modes l=2 and l=6 are shown.

Two positions for a half tube are to be found for the exclusive excitation of the mode l=2, the l=4 and l=6 vibration being of equal strength thereat. It must be noted that two piezoelements that lie in the same antinode disturbingly influence one another. The position z=0.666 L is derived as an especially effective location, whereby L is the length of the pipe. The l=2 mode has the greatest dilatation at this position. The l=4 and l=6 mode exhibit an opposite but equally weak dilatation at this position. Further piezoelements are to be placed at z=0.833 L in order to elimination the other modes. Here, the modes l=4 and l=6 likewise have an opposite dilatation that, however, is of the same strength. No force influence occurs at this position given the l=2 mode, since an oscillatory node is located here. Correspondingly mirrored, the piezoelements placed at the other tube half are at the positions z=0.333 L and z=0.167 L. The elements at z=0.333 L and z=0.666 L are driven to produce approximately 1.75 times less force than the piezoelements at z=0.167 L and z=0.833 L. The phase for the piezoelements at the same tube half is the same; however, it differs from tube half to tube half.

The piezoelements for the excitation of the mode l=4 are placed in the positions z=0.4 L and z=0.6 L since the l=4 mode exhibits the maximum dilatation here. In this position, the l=2 and l=6 modes are also excited with equal strength, this likewise being the case at the positions z=0.2 L and z=0.8 L. The elimination piezoelements are thus placed at these positions. They must be driven to produce approximately 2.6 times the force produced by the piezoelements at z=0.4 L and z=0.6 L, since the efficiency of the piezoelements here only amounts to approximately one-third since the dilatation is only approximately one-third as large. The phase of the piezoelement force for the piezoelements at z=0.4 and z=0.8 is identical and is oppositely directed at z=0.2 L and z=0.6 L. A number of elements, preferably six elements, are arranged distributed around the circumference at every longitudinal pipe position. The distribution preferably is symmetrical. Here, too, a quasi punctiform force generation or force introduction ensues.

These described positions are only exemplary. Other positions can also be selected, these being those positions at which a desired mode form can be efficiently excited with optimally few piezoelements and the excitation relationship of the two unintentionally co-excited modes is the same or similar The elimination piezoelements are placed at corresponding positions at which the co-excited modes exhibit the same relationship as at the excitation location.

In addition to the selection of different positions for the principal piezoelements, an arrangement is also possible wherein none of the three relevant longitudinal modes exhibits a node in the dilatation. The elements here are thus arranged only at a selected position and the position mirrored with respect thereto. In order to be able to designationally excite and eliminate modes, a frequency-dependent drive is required, with the different effectiveness of the force influence on the characteristic vibrations being taken into consideration, and all piezoelements can be driven in the same way here as a result of the symmetry properties. The 0.6 L position in combination with the antiphase 0.4 L position is especially effective here.

Although other modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance apparatus comprising:
   a gradient tube having a circumference, a length, and a middle relative to said length;
   at least one gradient coil arranged at said gradient tube and having current flowing therein, in the presence of a basic magnetic field, during operation of said gradient coil and thereby producing a Lorentz force which vibrates said gradient tube in a characteristic vibrational mode, said gradient coil being selected from the group of gradient coils comprising, relative to a Cartesian coordinate system, an x-direction gradient coil which produces an X vibrational mode, a y-direction gradient coil which produces a Y vibrational mode, and a z-direction gradient coil which produces a Z vibrational mode; and
   a plurality of driveable elements attached to said gradient tube which, in combination, produce a vibrational mode in said gradient tube to counteract the vibrational mode produced by said at least one gradient coil, said elements comprising elements selected from the group of elements consisting of a first group of elements, distributed only at said middle and around said circumference of said gradient tube, for producing an X vibrational mode to counteract the X vibrational mode produced by said x-direction gradient coil, a second group of elements, distributed only at said middle and around said circumference of said gradient tube, for producing a Y vibrational mode to counteract the Y vibrational mode produced by said y-direction gradient coil, and a third group of elements, distributed along said length and at respective, separate locations around said circumference of said gradient tube, for producing a Z vibrational mode to counteract the Z vibrational mode produced by said z-direction gradient coil.

2. A magnetic resonance apparatus as claimed in claim 1 wherein said first group of elements comprise elements placed on said gradient tube at respective positions for producing a vibrational mode having an uneven mode number, wherein said second group of elements comprise elements placed on said gradient tube at respective positions for producing a vibrational mode having an uneven mode number, and wherein said third group of elements comprise elements placed on said gradient tube at respective positions for producing a vibrational mode having an even mode number.

3. A magnetic resonance apparatus as claimed in claim 1 wherein each of the respective vibrational modes produced by said first, second and third groups of elements are selected from the group of modes consisting of circumferential vibrational modes and longitudinal vibrational modes.

4. A magnetic resonance apparatus as claimed in claim 1 wherein said first group of elements comprise elements placed on said gradient tube at respective positions for producing a circumferential vibrational mode and wherein said second group of elements comprise elements placed on said gradient tube at respective positions for producing a circumferential vibrational mode.

5. A magnetic resonance apparatus as claimed in claim 4 wherein each of said first group of elements and said second group of elements comprise elements placed on said gradient tube at respective positions for producing a circumferential mode m=1 and a circumferential mode m=3, wherein m is the mode number.

6. A magnetic resonance apparatus as claimed in claim 5 wherein each of said first group of elements and said second group of elements comprise elements placed on said gradient tube at respective positions for additionally producing a circumferential vibrational mode m=5.

7. A magnetic resonance apparatus as claimed in claim 1 wherein said third group of elements comprises elements placed on said gradient tube at respective positions for producing a longitudinal vibrational mode.

8. A magnetic resonance apparatus as claimed in claim 7 wherein said third group of elements comprise elements placed on said gradient tube at respective positions for producing a longitudinal vibrational mode l=2 and a longitudinal vibrational mode l=4, wherein l is the mode number.

9. A magnetic resonance apparatus as claimed in claim 8 wherein said third group of elements comprise elements placed on said gradient tube at respective positions for additionally producing a longitudinal vibrational mode l=6.

10. A magnetic resonance apparatus as claimed in claim 1 wherein each of said first group of elements, said second group of elements and said third group of elements comprise primary elements for generating said vibrational mode for counteracting the vibrational mode produced by said at least one gradient coil, plus at least one secondary vibrational mode, and secondary elements for producing a vibrational mode which counteracts said secondary vibrational mode.

11. A magnetic resonance apparatus as claimed in claim 10, wherein said secondary elements comprise elements selected from the group of elements consisting of elements placed on said gradient tube for counteracting a vibrational mode having an even mode number, and elements placed on said gradient tube for counteracting a vibrational mode having an odd vibrational mode number.

12. A magnetic resonance apparatus as claimed in claim 10 wherein said secondary elements further comprise elements for contributing to counteracting said vibrational mode produced by said at least one gradient coil.

13. A magnetic resonance apparatus as claimed in claim 10 wherein said secondary elements are driven in combination to produce an overall force on said gradient tube which substantially completely counteracts said second vibrational mode.

14. A magnetic resonance apparatus as claimed in claim 1 wherein each of said first group of elements, said second group of elements and said third group of elements comprise elements placed on said gradient tube for introducing a circumferential force into said gradient tube.

15. A magnetic resonance apparatus as claimed in claim 1 wherein each of said first group of elements, said second group of elements and said third group of elements comprise elements placed on said gradient tube for introducing a longitudinal force into said gradient tube.

16. A magnetic resonance apparatus as claimed in claim 1 wherein each of said first group of elements, said second group of elements and said third group of elements comprise elements placed on said gradient tube for introducing circumferential and longitudinal forces into said gradient tube.

17. A magnetic resonance apparatus as claimed in claim 1 wherein said gradient tube has an exterior, and wherein said first group of elements, said second group of elements and said third group of elements are disposed on said exterior of said gradient tube.

18. A magnetic resonance apparatus as claimed in claim 1 wherein said gradient tube has an interior, and wherein said first group of elements, said second group of elements and said third group of elements are disposed on said interior of said gradient tube.

19. A magnetic resonance apparatus as claimed in claim 1 wherein said gradient tube has an interior and an exterior, and wherein each of said first group of elements, said second group of elements and said third group of elements include elements disposed at said exterior of said gradient tube and at said interior of said gradient tube.

20. A magnetic resonance apparatus as claimed in claim 1 wherein the elements in said first group of elements are disposed in pairs at said gradient tube with the respective elements in each pair being disposed opposite each other at said gradient tube and driven with opposite phases.

21. A magnetic resonance apparatus as claimed in claim 1 wherein each of said first group of elements and said second group of elements comprise elements placed at said gradient tube at 0° and 180° which are driven to produce a vibrational mode m=1, and which secondarily produce vibrational modes m=3 and m=5, and elements disposed at ±45° and ±135° for counteracting said vibrational mode m=3 and said vibrational mode m=5, wherein m is the mode number.

22. A magnetic resonance apparatus as claimed in claim 1 wherein each of said first group of elements and said second group of elements comprise elements placed at said gradient tube at said 0° and 180° and driven to produce a vibrational mode m=3, and which secondarily produce a vibrational mode m=1 and a vibrational mode m=5, and elements placed at ±60° and ±120° at said gradient tube for producing vibrational modes which counteract said vibrational mode m=1 and m=5, wherein m is the mode number.

23. A magnetic resonance apparatus as claimed in claim 1 wherein said third group of elements comprise at least six elements placed equidistantly around the circumference of said gradient tube, all of said elements in said third group of elements being driven in phase.

24. A magnetic resonance apparatus as claimed in claim 23 wherein said third group of elements comprise elements placed at said gradient tube for producing a longitudinal vibrational mode l=2 at $2/6$ L and $4/6$ L, and which secondarily produce a longitudinal vibrational mode l=4 and a longitudinal vibrational mode l=6, and elements placed at $1/6$ L and $5/6$ L for counteracting said longitudinal vibrational mode l=4 and said longitudinal vibrational mode l=6, wherein l is the mode number and L is the length of said gradient tube.

25. A magnetic resonance apparatus as claimed in claim 23 wherein said third group of elements comprises elements placed at $4/10$ L and $6/10$ L for producing a longitudinal vibrational mode l=4, and which secondarily produce a longitudinal vibrational mode l=2 and a longitudinal vibrational mode l=6, and elements placed at $2/10$ L and $8/10$ L for counteracting said longitudinal vibrational mode l=2 and said longitudinal vibrational mode l=6, wherein l is the mode number and L is the length of the gradient tube.

26. A magnetic resonance apparatus as claimed in claim 1 wherein said at least one gradient coil has an operating frequency associated therewith, and wherein each of said first group of elements, said second group of elements and said third group of elements are driven to exert a force on said gradient tube dependent on said operating frequency of said at least one gradient coil.

27. A magnetic resonance apparatus as claimed in claim 26 wherein at least one of said first group of elements, said second group of elements and said third group of elements comprise elements placed at said gradient tube for producing a longitudinal vibrational mode, said elements placed on said gradient tube for producing said longitudinal vibrational mode being disposed only at two longitudinal positions which are symmetrical relative to a center of said tube and at which said longitudinal vibrational mode does not have an anti-node.

28. A magnetic resonance apparatus as claimed in claim 1 wherein all of said elements in said first group of elements and in said second group of elements and in said third group of elements are piezoelectric elements.

29. A magnetic resonance apparatus as claimed in claim 1 wherein each element in said first group of elements, said second group of elements and said third group of elements comprises a plurality of sub-elements disposed substantially at a predetermined position at said gradient tube.

30. A magnetic resonance apparatus as claimed in claim 29 wherein all of said sub-elements in said first group of elements, said second group of elements and said third group of elements are piezoelectric elements.

* * * * *